(12) United States Patent
Smith

(10) Patent No.: US 12,098,893 B2
(45) Date of Patent: Sep. 24, 2024

(54) TOPOLOGICAL HEATSINK

(71) Applicant: GE Aviation Systems Limited, Cheltenham (GB)

(72) Inventor: Michael James Smith, Chadlington (GB)

(73) Assignee: GE Aviation Systems Limited, Gloucestershire (GB)

( * ) Notice: Subject to any disclaimer, the term of this patent is extended or adjusted under 35 U.S.C. 154(b) by 107 days.

(21) Appl. No.: 16/989,403

(22) Filed: Aug. 10, 2020

(65) Prior Publication Data

US 2022/0042751 A1 Feb. 10, 2022

(51) Int. Cl.
*F28F 3/04* (2006.01)
*F28F 13/06* (2006.01)

(52) U.S. Cl.
CPC .............. *F28F 3/048* (2013.01); *F28F 13/06* (2013.01); *F28F 2215/04* (2013.01); *F28F 2215/08* (2013.01)

(58) Field of Classification Search
CPC ........ F28F 3/048; F28F 13/06; F28F 2215/04; F28F 2215/08
USPC ........................................................ 165/80.3
See application file for complete search history.

(56) References Cited

U.S. PATENT DOCUMENTS

| | | | | |
|---|---|---|---|---|
| 3,301,315 A | * | 1/1967 | Webb | H01L 23/4006 156/289 |
| 4,187,711 A | * | 2/1980 | Lavochkin | B21C 23/10 72/702 |
| 5,726,495 A | | 3/1998 | Aihara et al. | |
| 5,775,187 A | | 7/1998 | Nikolai et al. | |
| 6,138,489 A | * | 10/2000 | Eriksson | B21D 53/02 29/890.03 |
| 6,327,886 B1 | * | 12/2001 | Eriksson | H01L 21/4878 72/256 |
| 6,343,016 B1 | | 1/2002 | Lin | |
| 7,204,299 B2 | | 4/2007 | Bhatti et al. | |
| 7,443,678 B2 | * | 10/2008 | Han | F21V 29/89 361/704 |
| 7,810,552 B2 | | 10/2010 | Slaughter | |
| 8,297,341 B2 | * | 10/2012 | Liang | H05K 7/20409 165/185 |
| 9,599,410 B2 | | 3/2017 | Antel, Jr. et al. | |
| 9,791,219 B2 | * | 10/2017 | Gamborg | F28F 21/08 |
| 10,028,333 B2 | * | 7/2018 | Gu | H05K 7/20127 |
| 10,076,059 B2 | * | 9/2018 | Kim | H05K 5/03 |
| D851,051 S | * | 6/2019 | Ueda | D13/179 |
| 10,420,254 B2 | | 9/2019 | Balasubramanian et al. | |

(Continued)

FOREIGN PATENT DOCUMENTS

| | | |
|---|---|---|
| CN | 109156093 | 1/2019 |
| EP | 3279597 | 2/2018 |
| EP | 3279597 A1 | 2/2018 |

*Primary Examiner* — Claire E Rojohn, III
(74) *Attorney, Agent, or Firm* — Fitch, Even, Tabin & Flannery, LLP

(57) ABSTRACT

A heat sink for a heat-generating component of an electronic device has a backbone panel with opposing upper and lower surfaces. Cooling elements extend away from the upper surface of the heat sink and terminate in upper ends that define a topological surface. Thermally conducting structures extend away from the lower surface of the heat sink and terminate in tips that define a surface that is complementary to the surface of the heat-generating component of the electronic device.

16 Claims, 6 Drawing Sheets

(56) References Cited

U.S. PATENT DOCUMENTS

| | | | |
|---|---|---|---|
| D906,269 S * | 12/2020 | Cola | D13/179 |
| 2005/0185379 A1 | 8/2005 | Vinson et al. | |
| 2006/0171121 A1 * | 8/2006 | Bell | H05K 7/20509 |
| | | | 361/704 |
| 2009/0032217 A1 * | 2/2009 | Wayman | H01L 23/4006 |
| | | | 165/185 |
| 2009/0120612 A1 * | 5/2009 | Zhang | F21V 29/75 |
| | | | 165/80.3 |
| 2014/0071614 A1 * | 3/2014 | Kaldani | F28F 3/048 |
| | | | 361/679.46 |
| 2015/0257249 A1 | 9/2015 | Kim | |
| 2018/0292146 A1 | 10/2018 | Furrer et al. | |

\* cited by examiner

TOPOLOGICAL HEATSINK

TECHNICAL FIELD

The disclosure generally relates to heat sinks for electronic devices.

BACKGROUND

In response to consumer demand for cutting-edge capability, manufacturers of electronic devices are increasing the complexity and functionality while decreasing the size of the devices. Electronic devices such as computers, mobile devices, and entertainment systems typically have circuit boards with various components that generate heat. To protect the device from heat-related damage or failure, the circuit boards can be fitted with heat sinks or passive heat exchangers to dissipate the heat. Appropriate thermal management is helpful to efficiently decrease the concentration of heat in these devices.

An effective heat sink facilitates heat transfer between electronic components and the cooling air, typically by conduction from the circuit board to the heat sink and by convection from the heat sink to the cooling air. Heat sinks include a heat transfer interface that, on one side, thermally couples to the heat-generating electronic components. The opposite side of the heat sink has fins or other features that are fixed and extend away from the interface into the surrounding air. Thermal management is dependent on efficient heat transfer from the electronic components, through the heat transfer interface, along the fins, and to the surrounding air to effect cooling.

The arrangement of electronic components on the circuit board can present a highly complex landscape, with a lot of variation in the topology of the circuit board. As such, it can be difficult to establish conductive thermal heat transfer between the electronic components and the heat sink, which has led to reliance on convection between the electronic components and the heat sink and/or the addition of a conductive filler material between the electric components and the heat sink. Convection is a less desirable mode of heat transfer than conduction because conduction yields greater rates of heat transfer. The use of a filler material adds extra cost and complexity, which is not desirable.

BRIEF DESCRIPTION

In one aspect, the present disclosure generally relates to a heat sink for an electronic device having multiple heat generating components collectively defining a first topological surface with multiple peaks and valleys, the heat sink comprising a backbone panel having opposing upper and lower surfaces, with at least one of the upper and lower surfaces defining an envelope contour to the peaks and valleys, a plurality of structures, at least some of which are thermally conductive, extending downwardly from the lower surface and terminating in tips, which define a second topological surface complementary to the first topological surface, and a plurality of cooling elements extending upwardly away from the upper surface and terminating in upper ends.

In another aspect, the present disclosure generally relates to a heat sink comprising a backbone panel having opposing upper and lower surfaces and a generally constant thickness between the upper and lower surfaces, a plurality of spaced, thermally conducting structures extending downwardly from the lower surface and terminating in tips, which define a topological surface having peaks and valleys, a plurality of cooling elements extending upwardly away from the upper surface and terminating in upper ends, and wherein the lower surface defines an envelope contour for the peaks and valleys and the upper surface defines a smooth contour.

DETAILED DESCRIPTION

Figure 1:
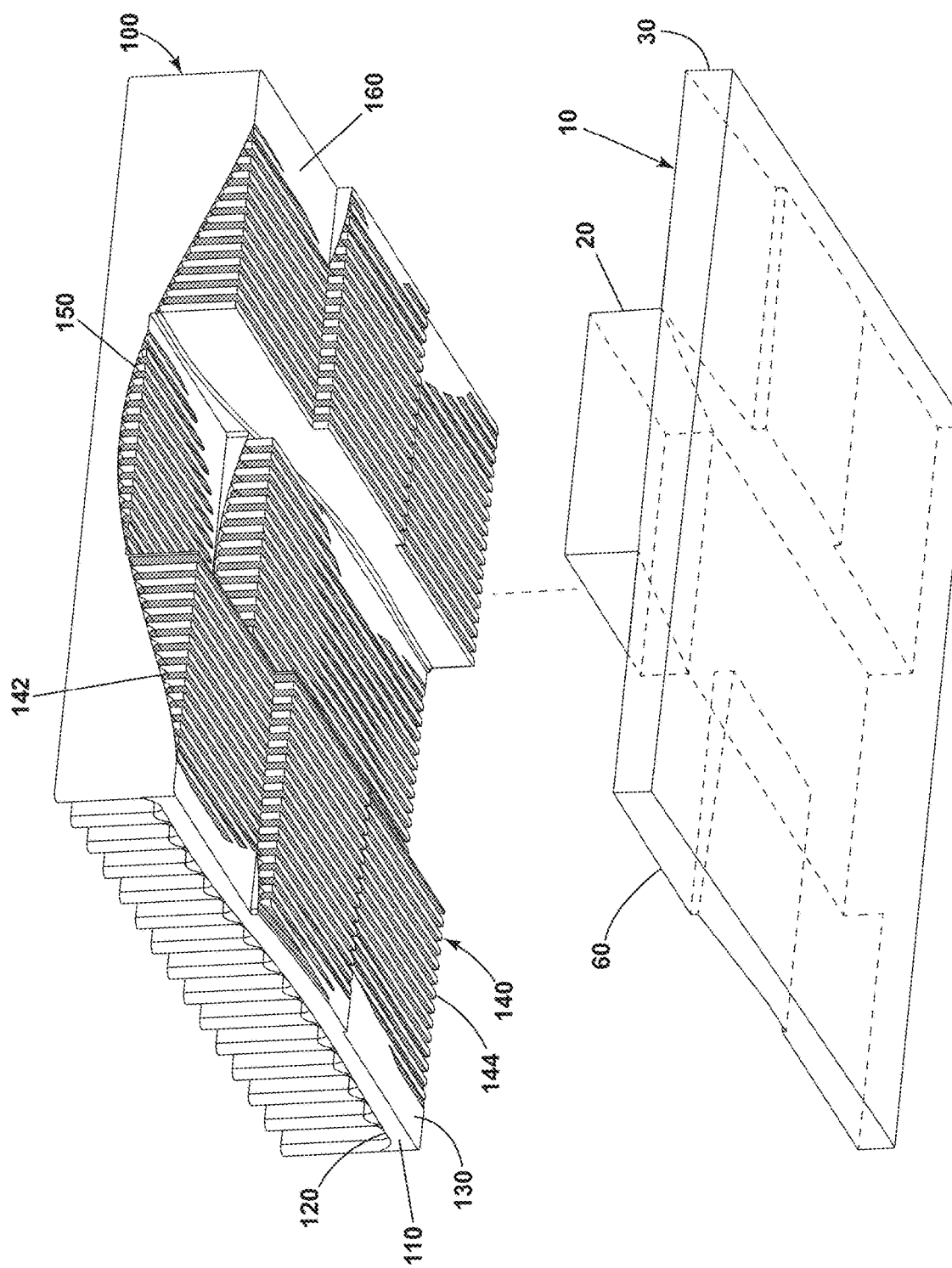
FIG. 1 is an exploded bottom perspective view of an electronic component with a surface having a topology in the form of a castellated surface and heat sink with a surface having a topology in the form of a complementary castellated surface, and a contoured upper surface defining an envelope for the electronic component castellated surface.

Aspects of the disclosure described herein are directed to a heat sink. For purposes of illustration, the present disclosure will be described with respect to an electronic circuit board. For example, the disclosure can have applicability in other electronic devices and can be used to provide benefits in industrial, commercial, and residential applications.

As used herein, the term "upstream" refers to a direction that is opposite the fluid flow direction, and the term "downstream" refers to a direction that is in the same direction as the fluid flow. The term "fore" or "forward" means in front of something and "aft" or "rearward" means behind something. For example, when used in terms of fluid flow, fore/forward can mean upstream and aft/rearward can mean downstream.

Additionally, as used herein, the terms "radial" or "radially" refer to a direction away from a defined or common center. For example, radial refers to a direction along a ray extending between a center longitudinal axis of an object and an outer circumference. Furthermore, as used herein, the term "set" or a "set" of elements can be any number of elements, including only one.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are only used for identification purposes to aid the reader's understanding of the present disclosure, and do not create limitations, particularly as to the position, orientation, or use of aspects of the disclosure described herein. Connection references (e.g., attached, coupled, secured, fastened, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

As used herein, the term "additive manufacturing" generally refers to manufacturing processes wherein successive layers of material(s) are provided on each other to "build-up," layer-by-layer, a three-dimensional component. The successive layers generally fuse together to form a monolithic unitary component, which can have a variety of integral sub-components.

Suitable additive manufacturing techniques in accordance with the present disclosure include, for example, Directed Energy Deposition (DED), Fused Deposition Modeling (FDM), Selective Laser Sintering (SLS), 3D printing such as by inkjets and laserjets, c), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Digital Light Processing (DLP), Direct Selective Laser Melting (DSLM), Selective Laser Melting (SLM), Direct Metal Laser Melting (DMLM), and other known processes.

In addition to using a direct metal laser sintering (DMLS) or direct metal laser melting (DMLM) process where an energy source is used to selectively sinter or melt portions of a layer of powder, it should be appreciated that according to alternative aspects of the present disclosure, the additive manufacturing process can be a "binder jetting" process. In this regard, binder jetting involves successively depositing layers of additive powder in a similar manner as described above. However, instead of using an energy source to generate an energy beam to selectively melt or fuse the additive powders, binder jetting involves selectively depositing a liquid binding agent onto each layer of powder. The liquid binding agent can be, for example, a photo-curable polymer or another liquid bonding agent. Other suitable additive manufacturing methods and variants are intended to be within the scope of the present subject matter.

In addition, it will be appreciated that a variety of materials and methods for bonding those materials can be used and are contemplated as within the scope of the present disclosure. As used herein, references to "fusing" can refer to any suitable process for creating a bonded layer of any of the above materials. For example, if an object is made from polymer, fusing can refer to creating a thermoset bond between polymer materials. If the object is epoxy, the bond can be formed by a crosslinking process. If the material is ceramic, the bond can be formed by a sintering process. If the material is powdered metal, the bond can be formed by a melting or sintering process. One skilled in the art will appreciate that other methods of fusing materials to make a component by additive manufacturing are possible, and the presently disclosed subject matter can be practiced with those methods.

In addition, the additive manufacturing process disclosed herein allows a single component to be formed from multiple materials. Thus, the components described herein can be formed from any suitable mixtures of the above materials. For example, a component can include multiple layers, segments, or parts that are formed using different materials, processes, or on different additive manufacturing machines. In this manner, components can be constructed which have different materials and material properties for meeting the demands of any particular application. In addition, although the components described herein are constructed entirely by additive manufacturing processes, it should be appreciated that in additional aspects of the present disclosure, all or a portion of these components can be formed via casting, machining, or any other suitable manufacturing process. Indeed, any suitable combination of materials and manufacturing methods can be used to form these components.

An exemplary additive manufacturing process will now be described. Additive manufacturing processes fabricate components using three-dimensional (3D) information, for example a three-dimensional computer model, of the component. Accordingly, a three-dimensional design model of the component can be defined prior to manufacturing. In this regard, a model or prototype of the component can be scanned to determine the three-dimensional information of the component. As another example, a model of the component can be constructed using a suitable computer aided design (CAD) program to define the three-dimensional design model of the component.

The design model can include 3D numeric coordinates of the entire configuration of the component including both external and internal surfaces of the component. For example, the design model can define the body, the surface, and/or internal passageways such as passageways, voids, support structures, etc. In one exemplary non-limiting example, the three-dimensional design model is converted into a set of slices or segments, e.g., along a central (e.g., vertical) axis of the component or any other suitable axis. Each slice can define a thin cross section of the component for a predetermined height of the slice. The set of successive cross-sectional slices together form the 3D component. The component is then "built-up" slice-by-slice, or layer-by-layer, until finished.

In this manner, the components described herein can be fabricated using the additive process, or more specifically each layer is successively formed, e.g., by fusing or polymerizing a plastic using laser energy or heat or by sintering or melting metal powder. For example, a particular type of additive manufacturing process can use an energy beam, for example, an electron beam or electromagnetic radiation such as a laser beam, to sinter or melt a powder material. Any suitable laser and laser parameters can be used, including considerations with respect to power, laser beam spot size, and scanning velocity. The build material can be formed by any suitable powder or material selected for enhanced strength, durability, and useful life, particularly at high temperatures.

Each successive layer can be, for example, between about 10 μm and 200 μm, although the thickness can be selected based on any number of parameters and can be any suitable size according to alternative aspects of the present disclosure. Therefore, utilizing the additive formation methods described above, the components described herein can have cross sections as thin as one thickness of an associated powder layer, e.g., 10 μm, utilized during the additive formation process.

In addition, utilizing an additive process, the surface finish and features of the components can vary as need depending on the application. For example, the surface finish can be adjusted (e.g., made smoother or rougher) by selecting appropriate laser scan parameters (e.g., laser power, scan speed, laser focal spot size, etc.) during the additive process, especially in the periphery of a cross-sectional layer, which corresponds to the part surface. For example, a rougher finish can be achieved by increasing laser scan speed or decreasing the size of the melt pool formed, and a smoother finish can be achieved by decreasing laser scan speed or increasing the size of the melt pool formed. The scanning pattern or laser power can also be changed to change the surface finish in a selected area.

Referring to FIG. 1, an assembly of an electronic device 10 with a corresponding heat sink 100 is illustrated, where the electronic device 10 may have multiple heat generating components 20 (e.g., integrated circuits, transistors, resistors, batteries, fuses, diodes, relays, transformers, inductors, switches, crystal oscillators, LEDs, and capacitors) mounted on a circuit board or other substrate 30 that mechanically supports and electrically connects the components 20. The arrangement of the components 20 on the substrate 30 can vary widely depending on the size and function of the electronic device 10. The size and shape of the components 20 can also vary widely (e.g., large cylindrical capacitors, small rectangular integrated circuits).

Collectively, when secured to the substrate 30, the components 20 define a virtual or effective upper surface, which is described as a first topological surface 60 having multiple peaks and valleys, where the peaks of the first topological surface 60 are defined by the uppermost faces of the components 20 and the valleys are defined as the spaces between components 20 or the topmost surfaces of components 20 that have relatively low profiles. In one way, the first topological surface 60 can be thought of as a virtual or effective upper surface, like an envelope over the surface. Such an envelope can be thought of as a cloth draped over the tops of the components 20 and the surface of the cloth forming the first topological surface 60.

The heat sink 100 comprises a backbone panel 110 having opposing upper and lower surfaces (120, 130). The backbone panel 110 can be any thickness, constant or varying, and is illustrated as having a constant thickness, which, by constant thickness, it is meant the thickness does not vary by more than 15%.

A plurality of structures 140 extends downwardly from the lower surface 130 of the backbone panel 110, while a plurality of cooling elements 180 extend upwardly from the upper surface 120. The structures 140 are coupled to the backbone panel 110 by roots 142 and terminate in lower ends, or tips 144. The tips 144 define a second topological surface 160 that can have stepped, angled, or curved features including peaks and valleys.

Figure 2:
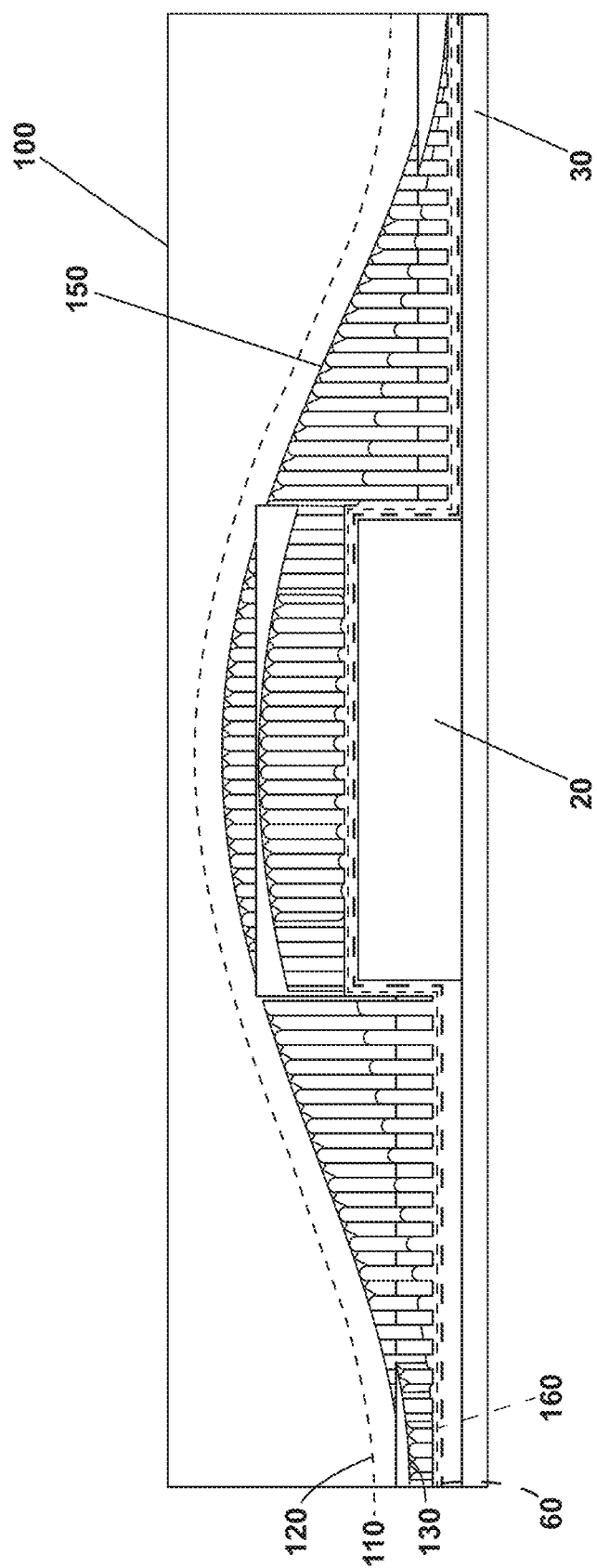
FIG. 2 is a side view of the heat sink of FIG. 1 assembled with the electric component of FIG. 1 such that the complementary castellated surfaces confront each other and illustrating the relationship between the envelope and the castellated surface of the electronic component.

Referring now to FIG. 2, the second topological surface 160 is complementary at least in part to the first topological surface 60. The second topological surface 160 is a castellated contour with peaks and valleys. The "peaks" and "valleys" are shown in FIG. 2 as rectilinear areas with different elevations, the lower elevations representing the valleys and the higher elevations representing the peaks. The peaks and valleys of the second topological surface 160 at least partially match the peaks and valleys of the first topological surface 60. For example, the size and shape of a component 20 defines a peak in the first topological surface 60, and that peak corresponds to a valley of about the same size and shape in the second topological surface 160. That is, features of the second topological surface 160 correspond to features of the first topological surface 60 which are determined at least in part by the components 20.

Either the upper or lower surface (120, 130) of the backbone panel 110 can define an envelope contour 150 that has a sweeping, curved surface outlining the extremes of the peaks and valleys of the second topological surface 160. The envelope contour 150 outlines the peaks and valleys of the second topological surface 160, and therefore also outlines the first topological surface 60 and the castellated contour of the components 20. The envelope contour 150 to the peaks and valleys defines a smooth contour, or a shape without any steps covering the peaks and the valleys of the second topological surface 160. In other words, the envelope contour 150 is a curved surface that demarcates the upper and lower limits of the peaks and valleys of the castellated contour that describes the landscape of components 20.

Figure 3:
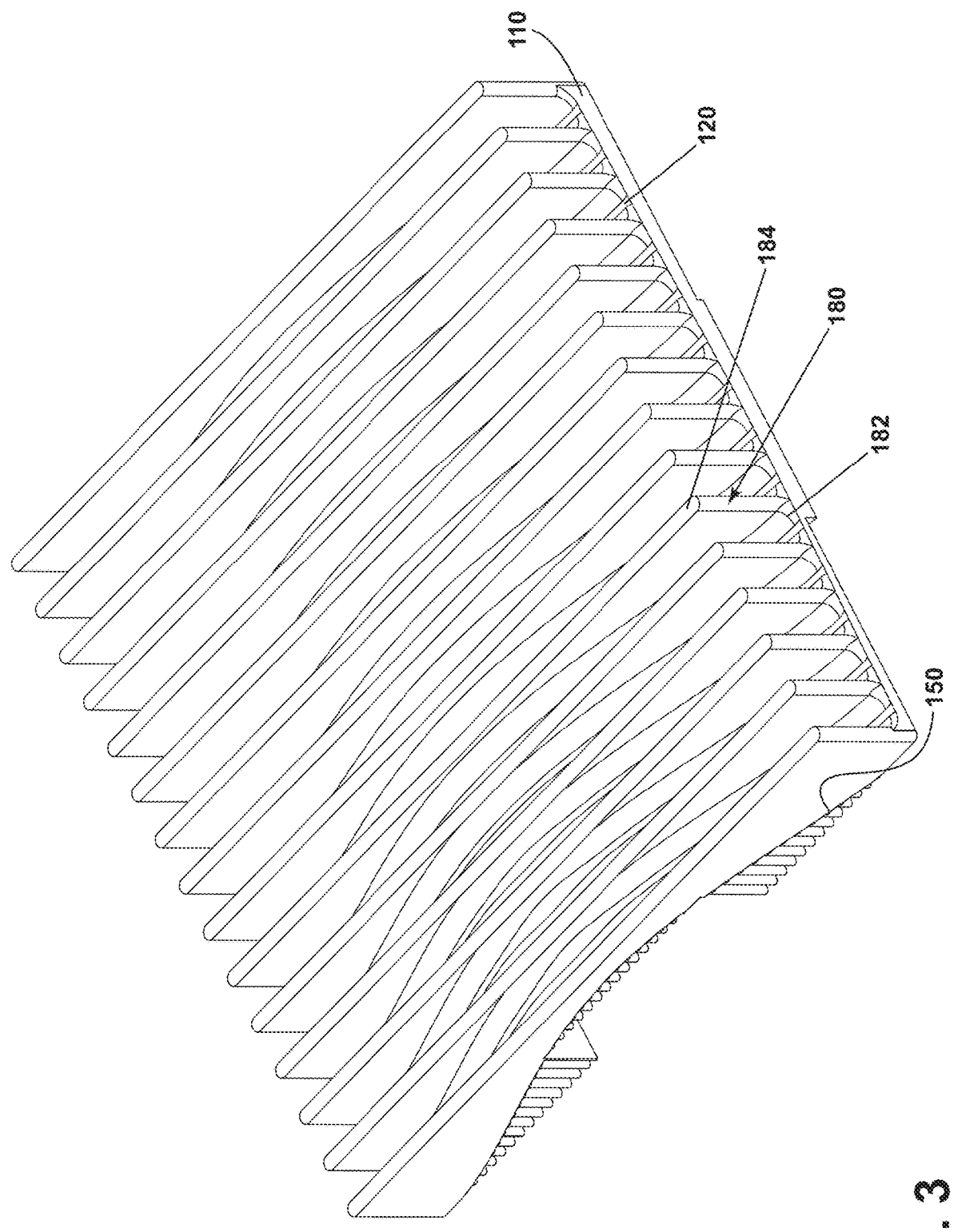
FIG. 3 is a top perspective view of a heat sink.

Turning now to FIG. 3, the plurality of cooling elements 180 extends upwardly away from the upper surface 120 of the backbone panel 110. The cooling elements 180 are coupled to the backbone panel 110 at a base 182 and terminate in upper ends 184. The cooling elements 180 can be linear and arranged in parallel, although other shapes, such as curvilinear, and other spacing, such as non-parallel, are contemplated. The cooling elements 180 can be structured as fins, and can be spaced from each other. As shown in FIG. 3, the upper ends 184 of the cooling elements 180 can terminate at a common elevation. In this non-limiting case, the upper ends 184 define a flat even plane, even while the cooling elements 180 vary in height along their length due to the shape of the envelope contour 150.

Figure 4:
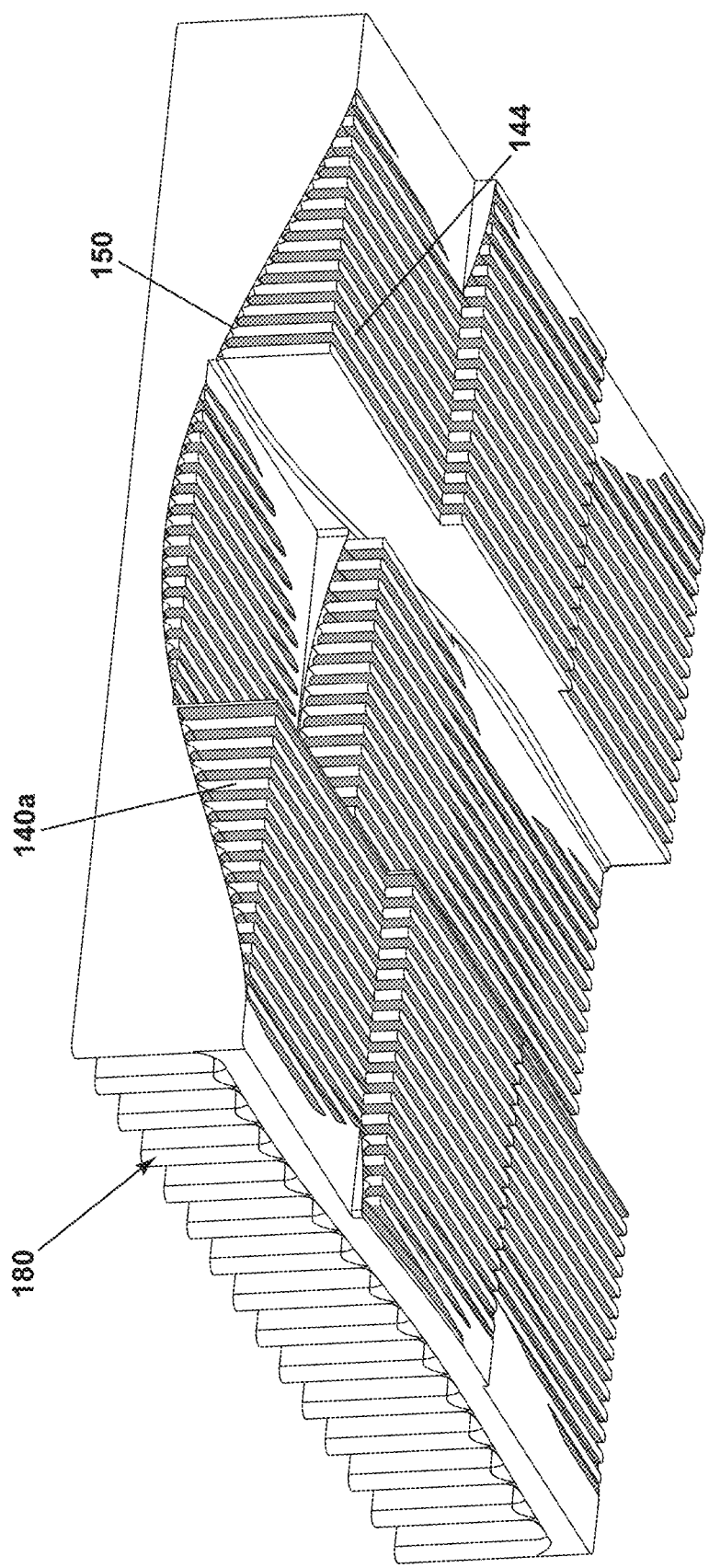
FIG. 4 is a bottom perspective view of a heat sink showing cooling and thermal conducting structures in the form of fins defining the castellated surface of the heat sink.
Figure 5:
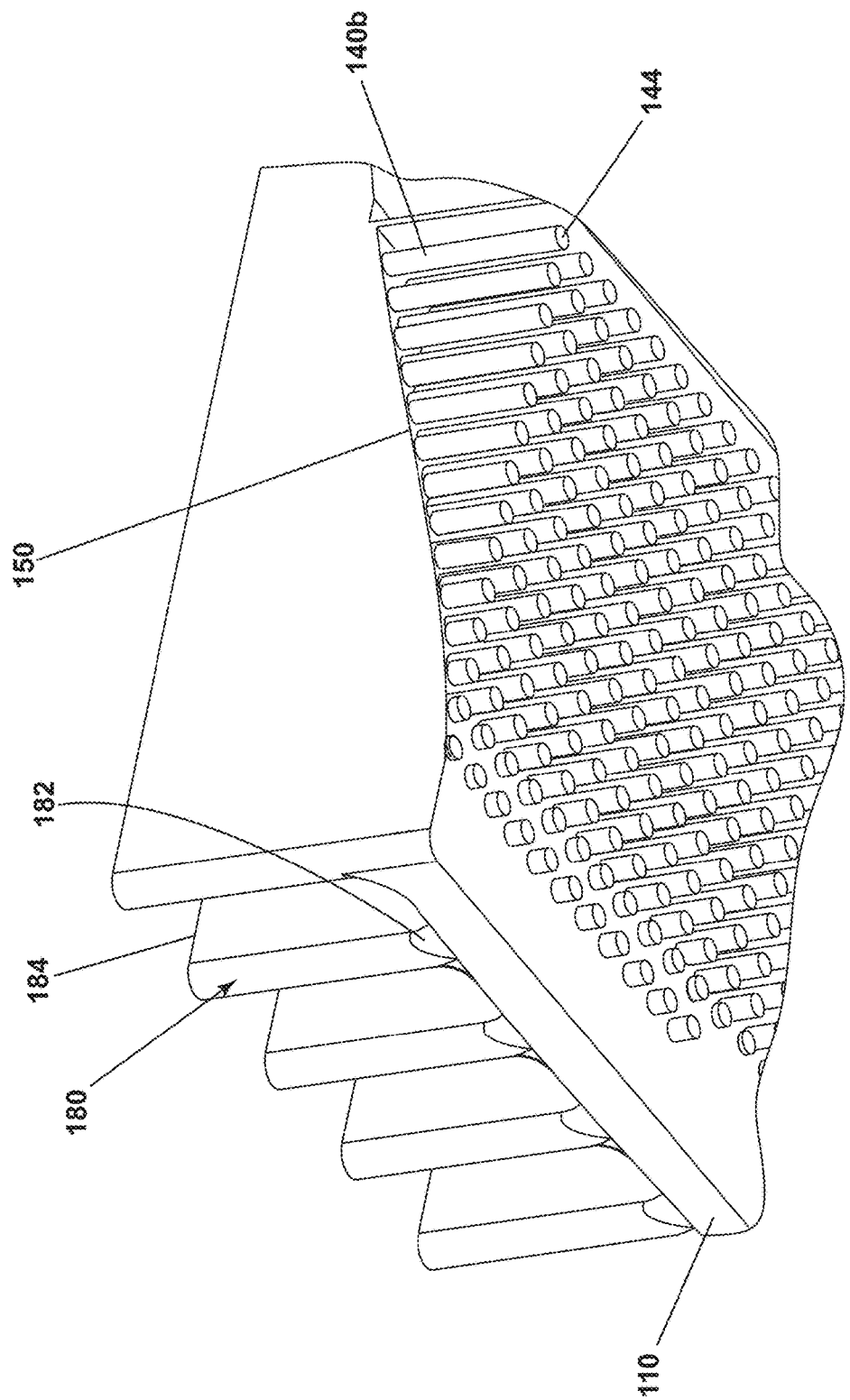
FIG. 5 is a partial bottom perspective view of a heat sink with heating conducting structures in the form of posts.

Referring to FIG. 4, the structures 140 extending downwardly from the backbone panel 110 can be spaced from each other. The structures 140 can be arranged in lines, which can be orthogonal to the arranged lines of the cooling elements 180. Other exemplary forms of the structures 140 include a latticework with repeating regular or random shapes, for example, a honeycomb configuration. Exemplary forms of the structures 140 are illustrated in FIG. 4 as rib structures 140 a and in FIG. 5 as post structures 140 b. In any form, the tips 144 of the structures 140 collectively delineate the second topological surface 160.

At least some of the structures 140 are thermally conductive. The shape and arrangement of the structures 140 increases conductive heat transfer and can be different from the shapes and arrangements of cooling elements 180. While the structures 140 expedite heat transfer by conduction, the shape and arrangement of the cooling elements 180 prevents air flow stagnation and facilitates cooling by convection.

Figure 6:
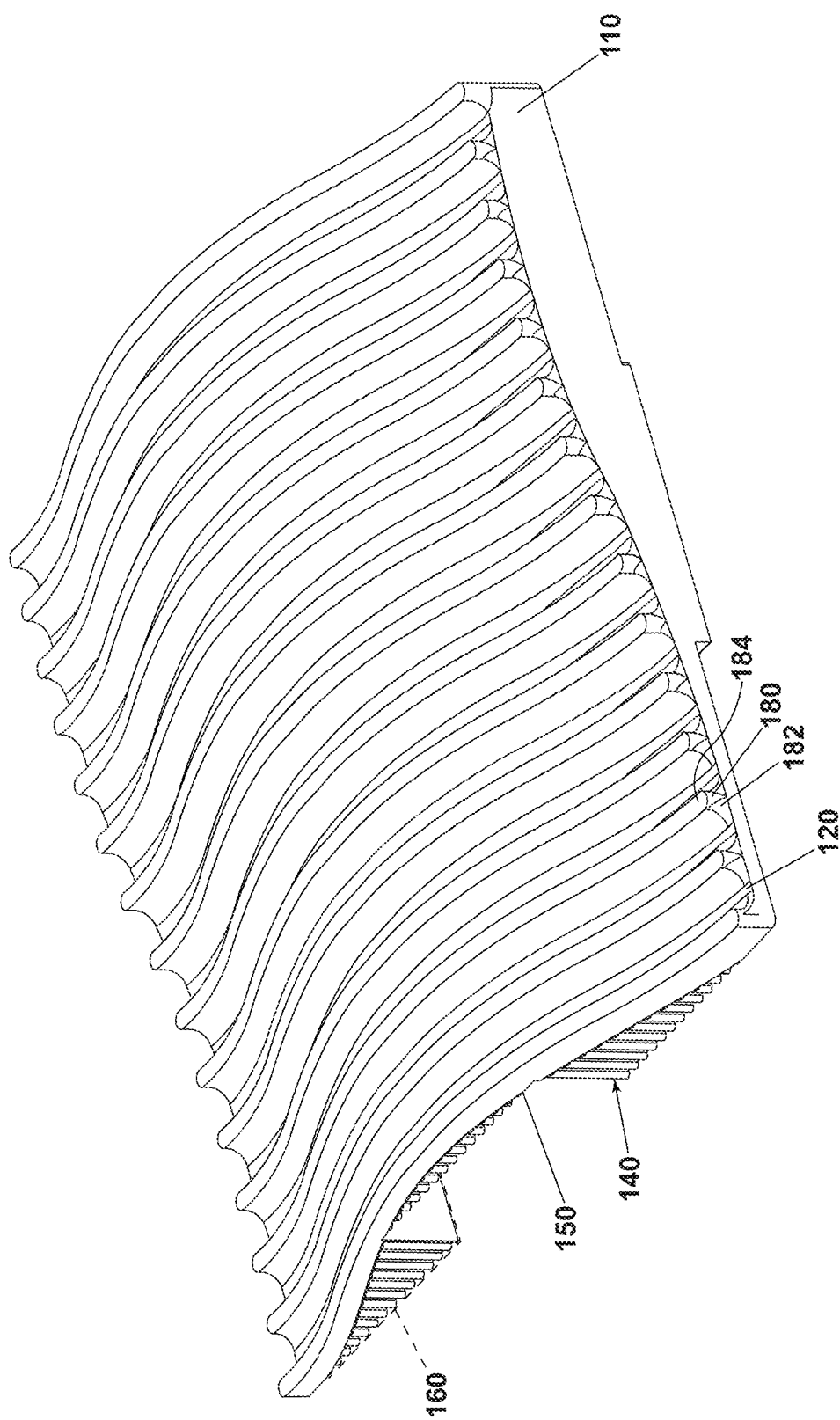
FIG. 6 is a top perspective view of a contoured heat sink with constant height fins extending upwardly from a panel surface.

Turning to FIG. 6, another exemplary form of the heat sink 100 is shown where the upper ends 184 of the cooling elements 180 are all about the same height above the upper surface 120. That is, the height of the cooling elements 180 is such that a surface defined by the upper ends 184 of the cooling elements 180 is parallel to and follows at least part of the curved surface defined by the envelope contour 150. The backbone panel 110, structures 140, and cooling elements 180 can be a monolithic body where the structures 140 and cooling elements 180 are formed without the removal of material from the monolithic body.

The spaces between cooling elements 180 are of sufficient width to allow flow of a cooling medium such as air, gas, water or other fluid to improve convective cooling. The space defined by the upper surface 120 of the backbone panel 110 and the adjacent cooling element fins 180 forms an air flow channel which has a smooth curved surface to enable cooling air to pass through without stagnating against a wall, step, or indentation in surface. The envelope contour 150 facilitates the flow of cooling medium by providing a surface with a gradual incline or decline over which the cooling medium can move smoothly. The envelope contour 150 eliminates steps and other harsh angles that can stall, hamper, or impede the flow of cooling medium.

The thermally conducting structures 140 form a castellated profile that closely matches the shapes of the components 20. Heat-conducting fillers situated between the components 20 and the heat sink 100 can expand between the structures 140 formed as ribs 104 a or posts 140 b to decrease or eliminate air gaps that impede heat transfer by conduction. The ribs 104 *a* or posts 140 *b* can be arranged in rows or lines set apart from one another or in other spaced configurations. The heat conducting fillers can also increase the contact surface area to improve the conduction of heat away from the components 20. Further, considering that the envelope contour 150 can potentially add mass to the heat sink 100, the ribbing of the structures 140 can mitigate the overall mass of the heat sink 100.

In a second exemplary case, the heat sink can have a backbone panel 110 with opposing upper and lower surfaces (120, 130) and a generally constant thickness between the upper and lower surfaces (120, 130). The heat sink 100 can further have a plurality of spaced, thermally conducting structures 140 extending downwardly from the lower surface 130 and terminating in tips 144, which define a topological surface having peaks and valleys as well as a plurality of cooling elements 180 extending upwardly away from the upper surface 120 and terminating in upper ends 184. The lower surface 130 defines an envelope contour 150 for the peaks and valleys and the upper surface 120 defines a smooth contour. The second topological surface 160 can be described as a castellated contour with peaks and valleys. Further, in this exemplary case, the backbone panel 110, plurality of structures 140, and plurality of cooling elements 180 are a monolithic body, where the structures 140 and cooling elements 180 are formed without the removal of material from the monolithic body.

Benefits of the present disclosure include a more effective heat transfer in comparison with conventional heat sink designs. For example, conventional heat sinks for electrical component packages can include external surface features that cause stagnation zones for convective air flow. In these conventional heat sinks, the heat transfer by convection is inefficient because the surface features create zones where the air cannot effectively circulate. The sloped, sculpted surface of the heatsink between the cooling elements as described herein, however, is configured to guide and facilitate smooth airflow and eliminate or reduce the stagnation zones. As such, the efficiency of the heat transfer by air movement over the heat sink described herein is increased when compared to the conventional heat sinks. The sculpted profile increases the heat transfer capability up to the point of optimizing the heat transfer rate for given topology, thereby further expanding and improving the compatibility of the heat sink.

Other benefits of the present disclosure include reduced mass of the heatsink for improved efficiency of heat transfer. For example, conventional heat sinks can be configured with solid, relatively heavy portions near the stagnation points, making those regions inefficient with regard to weight as the poor airflow does not carry away heat from those regions. The spaced structures between the component surface and the backbone of the heatsink as described herein effectively reduce the overall mass and ensure that the heat transfer is efficient. The use of fins, pins, and other structures to fully bridge the volume between the differing internal and external profiles of the heatsink improves the weight efficiency of the heat sink described herein.

It is further contemplated that the spaced structures allow for improved thermal conductivity. In electronics that utilize conventional heat sinks, thermal interface materials are compressed between the component surface and the heat sink. When the surfaces of the heat sink and components are uniformly solid and flat, compression can cause the material to escape around the edges leading to contamination or other risks to the system. The spaced structures of the heat sink described herein provide escape channels for the material to occupy upon compression. In these channels, the material can expand both upward and outward, contacting the surfaces of the heat sink structures. In turn, the increased contact surface areas between the components and the material, and between the material and the heat sink allow for improved heat transfer by conduction and decreased risks associated with compression. In environments utilizing electronics systems, the improved efficiency of the heat sink and decreased risks can increase the longevity of components.

Many other possible configurations in addition to those shown in the above figures are contemplated by the present disclosure. To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the disclosure are provided by the subject matter of the following clauses:

A heat sink for an electronic device having multiple heat generating components collectively defining a first topological surface with multiple peaks and valleys, the heat sink comprising: a backbone panel having opposing upper and lower surfaces, with at least one of the upper and lower surfaces defining an envelope contour to the peaks and valleys; a plurality of structures, at least some of which are thermally conductive, extending downwardly from the lower surface and terminating in tips, which define a second topological surface complementary to the first topological surface; and a plurality of cooling elements extending upwardly away from the upper surface and terminating in upper ends.

The heat sink of any preceding clause wherein the backbone panel has generally constant thickness.

The heat sink of any preceding clause wherein the constant thickness varies by less than 15%.

The heat sink of any preceding clause wherein the second topological surface defines a castellated contour with peaks and valleys.

The heat sink of any preceding clause wherein the envelope contour defines an envelope for the peaks and valleys of the castellated contour.

The heat sink of any preceding clause wherein the envelope contour defines a smooth contour without any steps.

The heat sink of any preceding clause wherein the plurality of structures are spaced from each other.

The heat sink of any preceding clause wherein the plurality of structures are at least one of ribs or posts.

The heat sink of any preceding clause wherein the ribs or posts are arranged in lines.

The heat sink of any preceding clause wherein the cooling elements are arranged in lines, which are orthogonal to the arranged lines of the ribs or posts.

The heat sink of any preceding clause wherein the structures define an latticework.

The heat sink of any preceding clause wherein the latticework is a honeycomb.

The heat sink of any preceding clause wherein the cooling elements are fins.

The heat sink of any preceding clause wherein the fins are spaced from each other.

The heat sink of any preceding clause wherein the upper ends terminate at a common elevation.

The heat sink of any preceding clause wherein the upper ends are the same height above the upper surface.

The heat sink of any preceding clause wherein the backbone panel, plurality of structures, and plurality of cooling elements are a monolithic body, with the structures and elements being formed without the removal of material from the monolithic body.

A heat sink comprising: a backbone panel having opposing upper and lower surfaces and a generally constant thickness between the upper and lower surfaces, a plurality of spaced, thermally conducting structures extending downwardly from the lower surface and terminating in tips, which define a topological surface having peaks and valleys; a plurality of cooling elements extending upwardly away from the upper surface and terminating in upper ends; and wherein the lower surface defines an envelope contour for the peaks and valleys and the upper surface defines a smooth contour.

The heat sink of any preceding clause wherein the second topological surface defines a castellated contour with peaks and valleys.

The heat sink of any preceding clause wherein the backbone panel, plurality of structures, and plurality of cooling elements are a monolithic body, with the structures and elements being formed without the removal of material from the monolithic body.

What is claimed is:

1. An apparatus comprising:
   an electronic device having a plurality of heat generating components collectively defining a first topological surface with multiple peaks and valleys;
   a heat sink comprising:
   a backbone panel having opposing upper and lower surfaces, with the lower surface defining an envelope contour to the peaks and valleys, the envelope contour defining a plurality of discrete smooth curved contours without any steps;
   a plurality of structures, at least some of which are thermally conductive, extending downwardly from the lower surface and terminating in tips, which define a second topological surface complementary to the first topological surface, and wherein the plurality of structures comprise spaced-apart fins that extend away from the heat sink and further wherein at least some of the plurality of discrete smooth curved contours each have a discrete group of the spaced-apart fins;
   a heat conducting filler disposed between and in contact with the heat generating components and the plurality of structures to provide a thermally conductive path from the heat generating components and the heat sink; and
   a plurality of cooling elements extending upwardly away from the upper surface and terminating in upper ends;
   the plurality of structures being configured to transfer heat by conduction from the heat generating components and the plurality of cooling elements being configured to transfer heat by convection to provide cooling.

2. The apparatus of claim 1 wherein the backbone panel has a thickness that varies by less than 15%.

3. The apparatus of claim 1 wherein the second topological surface defines a castellated contour with peaks and valleys.

4. The apparatus of claim 3 wherein the envelope contour defines an envelope for the peaks and valleys of the castellated contour.

5. The apparatus of claim 1 wherein the fins are arranged in lines.

6. The apparatus of claim 5 wherein the cooling elements are arranged in lines, which are orthogonal to the arranged lines of the fins.

7. The heat sink of claim 1 wherein the structures define an latticework.

8. The heat sink of claim 7 wherein the latticework is a honeycomb.

9. The apparatus of claim 1 wherein the cooling elements are fins.

10. The apparatus of claim 9 wherein the fins are spaced from each other.

11. The apparatus of claim 1 wherein the upper ends terminate at a common elevation.

12. The heat sink of claim 1 wherein the upper ends are the same height above the upper surface.

13. The apparatus of claim 1 wherein the backbone panel, plurality of structures, and plurality of cooling elements are a monolithic body, with the structures and elements being formed without the removal of material from the monolithic body.

14. An apparatus comprising:
   an electronic device having a plurality of heat generating components collectively defining a first topological surface with multiple peaks and valleys;
   a heat sink comprising:
   a backbone panel having opposing upper and lower surfaces and a thickness that varies by less than 15% between the upper and lower surfaces
   a plurality of thermally convective cooling elements extending upwardly away from the upper surface of the backbone panel and terminating in upper ends;
   a plurality of thermally conducting spaced-apart fins extending downwardly from the lower surface of the backbone panel and towards the plurality of heat generating components and terminating in tips that define a topological surface having peaks and valleys, the plurality of spaced-apart fins being in thermally-conductive contact with a heat conducting filler that is disposed in thermally-conductive contact with the heat generating components to thereby form a thermally conductive path from the heat generating components to the plurality of thermally convective cooling elements via the plurality of thermally conducting spaced-apart fins;
   and
wherein the lower surface defines an envelope contour defining a plurality of discrete smooth curved contours without any steps for the peaks and valleys and the upper surface defines a smooth contour, and wherein at least some of the plurality of discrete smooth curved contours each have a discrete group of the spaced-apart fins.

15. The apparatus of claim 14 wherein the topological surface defines a castellated contour with peaks and valleys.

16. The apparatus of claim 15 wherein the backbone panel, plurality of structures, and plurality of cooling elements are a monolithic body, with the structures and elements being formed without the removal of material from the monolithic body.

* * * * *